(12) United States Patent
Jakushokas et al.

(10) Patent No.: US 9,312,326 B2
(45) Date of Patent: Apr. 12, 2016

(54) METAL-INSULATOR-METAL CAPACITOR STRUCTURES

(71) Applicant: QUALCOMM, Incorporated, San Diego, CA (US)

(72) Inventors: Renatas Jakushokas, San Diego, CA (US); Vaishnav Srinivas, San Diego, CA (US); Robert Won Chol Kim, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/688,807

(22) Filed: Apr. 16, 2015

(65) Prior Publication Data

US 2015/0221716 A1    Aug. 6, 2015

Related U.S. Application Data

(62) Division of application No. 13/917,549, filed on Jun. 13, 2013, now Pat. No. 9,041,148.

(51) Int. Cl.
| | |
|---|---|
| H01L 49/02 | (2006.01) |
| H01L 23/522 | (2006.01) |
| H01L 27/08 | (2006.01) |
| H01G 4/33 | (2006.01) |
| H01G 4/38 | (2006.01) |

(Continued)

(52) U.S. Cl.
CPC .............. *H01L 28/60* (2013.01); *H01G 4/002* (2013.01); *H01G 4/005* (2013.01); *H01G 4/33* (2013.01); *H01G 4/385* (2013.01); *H01L 23/5223* (2013.01); *H01L 27/0805* (2013.01); *H01L 28/40* (2013.01); *H01L 28/87* (2013.01); *H01L 28/91* (2013.01); *H01L 2924/0002* (2013.01)

(58) Field of Classification Search
CPC ......... H01L 28/40; H01L 28/87; H01L 28/91; H01L 29/7408; H01L 27/1255; H01L 27/1085
See application file for complete search history.

(56) References Cited

U.S. PATENT DOCUMENTS

| | | | |
|---|---|---|---|
| 6,777,776 | B2 | 8/2004 | Hieda |
| 6,777,777 | B1 | 8/2004 | Kar-Roy et al. |

(Continued)

OTHER PUBLICATIONS

International Search Report and Written Opinion—PCT/US2014/042404—ISA/EPO—Nov. 28, 2014.

(Continued)

*Primary Examiner* — Phat X Cao
(74) *Attorney, Agent, or Firm* — Novak Druce Connolly Bove + Quigg LLP

(57) ABSTRACT

Capacitor structures capable of providing both low-voltage capacitors and high-voltage capacitors are described herein. In one embodiment, a capacitor structure comprises a first electrode formed from a first metal layer, a second electrode formed from a second metal layer, and a third electrode formed from a third metal layer, wherein second and third electrodes are spaced farther apart than the first and second electrodes. The capacitor structure also comprises a first dielectric layer between the first and second electrodes, and a second dielectric layer between the second and third metal layers, wherein the second dielectric layer has a larger thickness than the first dielectric layer. The first electrode is coupled to a first power-supply rail, the third electrode is coupled to a second power-supply rail, and the second power-supply rail has a higher power-supply voltage than the first power-supply rail.

9 Claims, 16 Drawing Sheets

(51) Int. Cl.
  *H01G 4/002* (2006.01)
  *H01G 4/005* (2006.01)

(56) References Cited

U.S. PATENT DOCUMENTS

| | | |
|---|---|---|
| 6,838,717 B1 | 1/2005 | Yen et al. |
| 6,977,198 B2 | 12/2005 | Gau |
| 7,312,118 B2 | 12/2007 | Kiyotoshi |
| 7,317,221 B2 | 1/2008 | Chang et al. |
| 7,629,222 B2 | 12/2009 | Park et al. |
| 7,915,135 B2 | 3/2011 | Wang et al. |
| 2004/0026750 A1 | 2/2004 | Takamura |
| 2005/0068014 A1 | 3/2005 | Dillon et al. |
| 2006/0070219 A1 | 4/2006 | Palanduz et al. |
| 2007/0069384 A1* | 3/2007 | Watanabe .................. 257/758 |
| 2007/0209178 A1 | 9/2007 | Savic et al. |
| 2011/0032660 A1 | 2/2011 | Dunn et al. |
| 2013/0175590 A1* | 7/2013 | Kim .................. 257/296 |
| 2013/0320494 A1 | 12/2013 | Zhu et al. |
| 2014/0264740 A1 | 9/2014 | Stribley |
| 2014/0367757 A1 | 12/2014 | Jakushokas et al. |

OTHER PUBLICATIONS

Partial International Search Report—PCT/US2014/042404—ISA/EPO—Oct. 2, 2014.
Co-pending U.S. Appl. No. 13/919,790, filed Jun. 17, 2013.
Co-pending U.S. Appl. No. 14/264,620, filed Apr. 29, 2014.

* cited by examiner

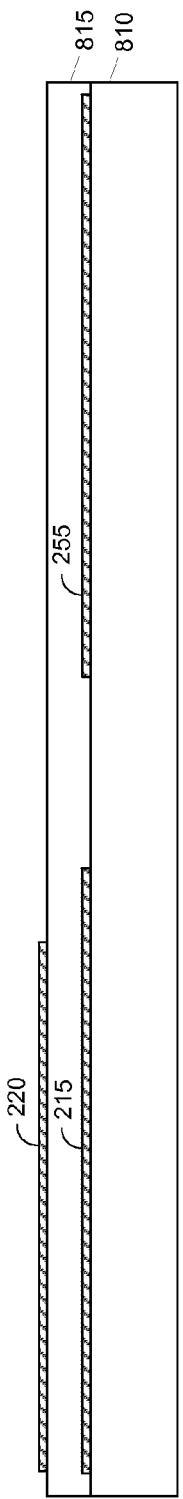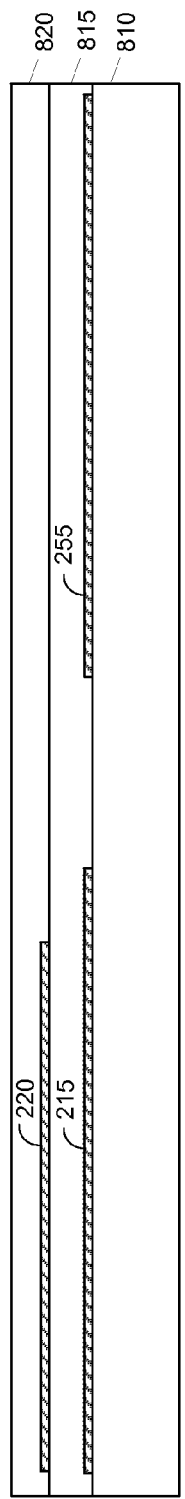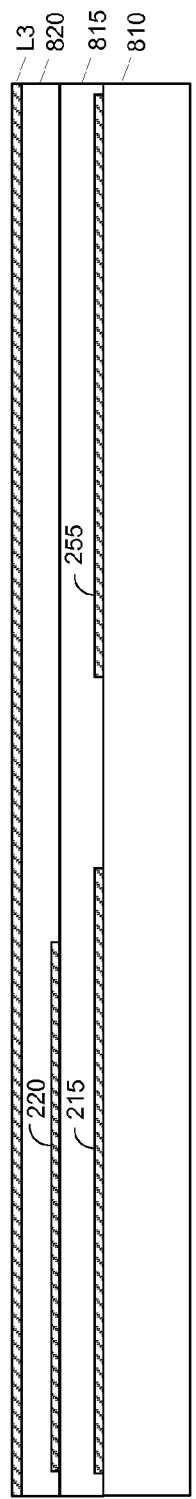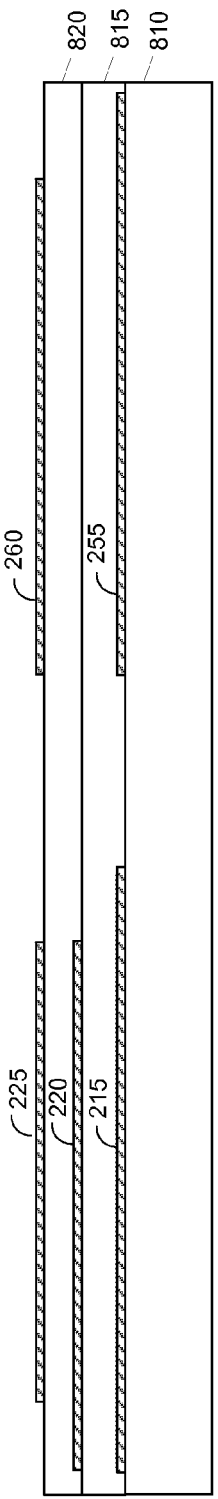

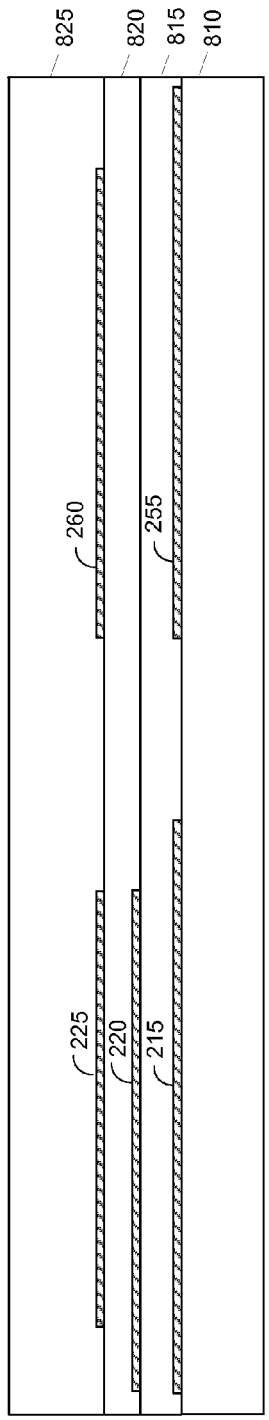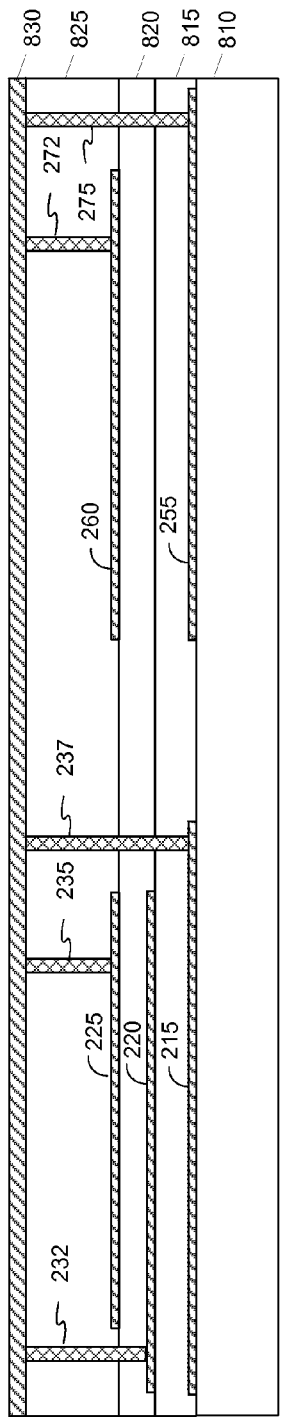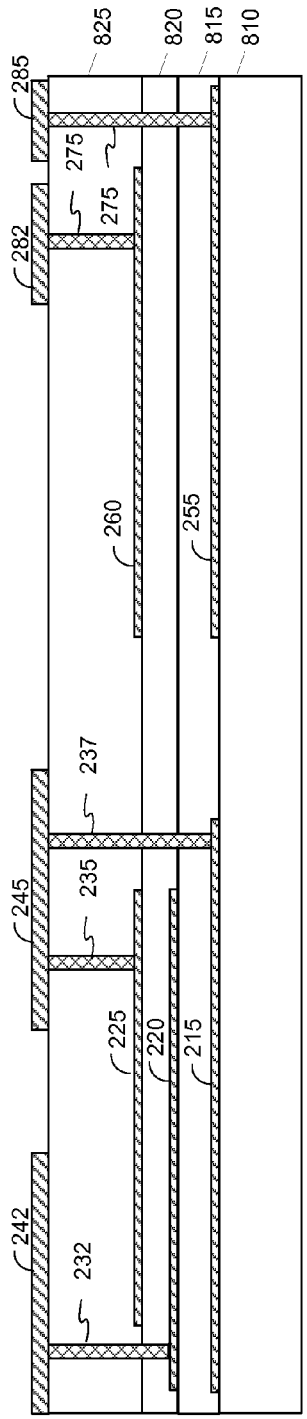

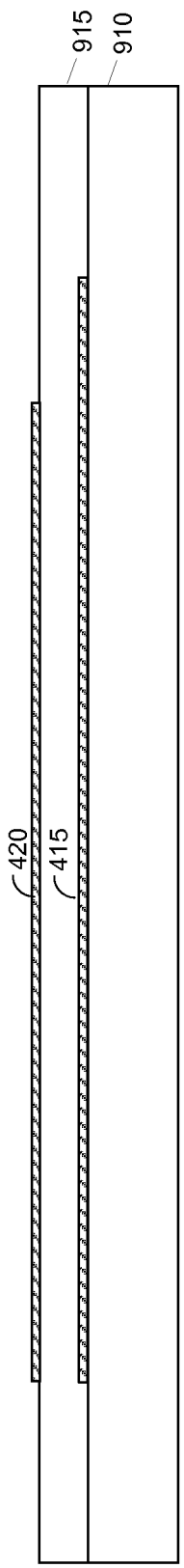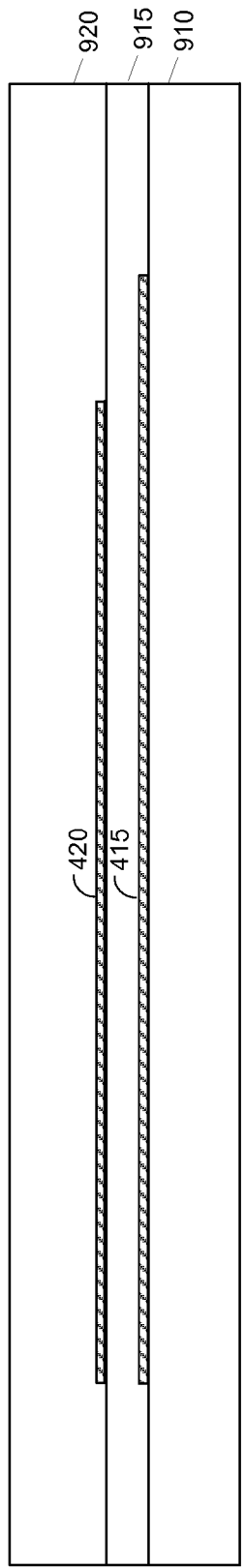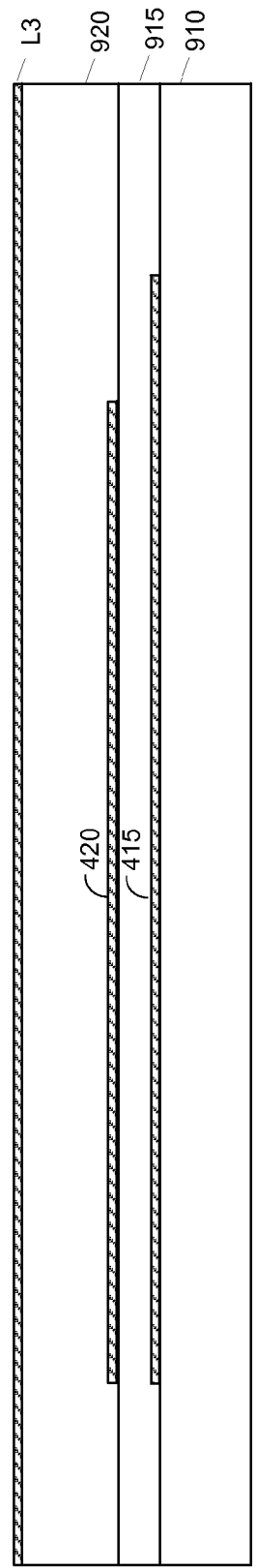

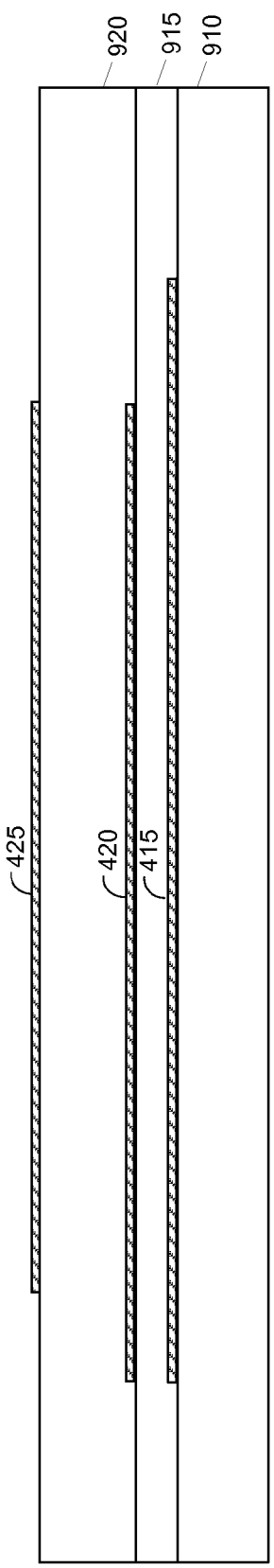
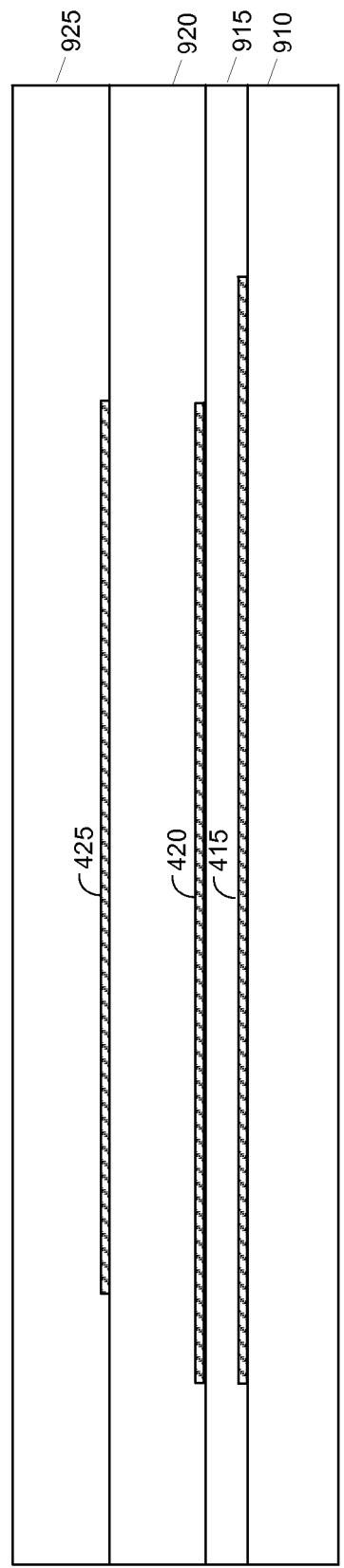

US 9,312,326 B2

METAL-INSULATOR-METAL CAPACITOR STRUCTURES

RELATED APPLICATION

The present application is a divisional of U.S. application Ser. No. 13/917,549, filed on Jun. 13, 2013, the entire specification of which is incorporated herein by reference.

BACKGROUND

1. Field

Aspects of the present disclosure relate generally to capacitors, and more particularly, to metal-insulator-metal (MIM) capacitor.

2. Background

Decoupling capacitors are commonly used in a chip to filter out noise on a power supply, in which the decoupling capacitors are coupled between two power-supply rails (e.g., Vdd and Vss) of the power supply. Typically, a decoupling capacitor is implemented using a metal-insulator-metal (MIM) capacitor comprising two metal layers and a dielectric layer disposed between the metal layers.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a capacitor structure is provided. The capacitor structure comprises a first electrode formed from a first metal layer, a second electrode formed from a second metal layer, and a third electrode formed from a third metal layer, wherein second and third electrodes are spaced farther apart than the first and second electrodes. The capacitor structure also comprises a first dielectric layer between the first and second electrodes, and a second dielectric layer between the second and third metal layers, wherein the second dielectric layer has a larger thickness than the first dielectric layer. The first electrode is coupled to a first power-supply rail, the third electrode is coupled to a second power-supply rail, and the second power-supply rail has a higher power-supply voltage than the first power-supply rail.

A second aspect relates to an apparatus. The apparatus comprises means for attenuating noise on a first power-supply rail, and means for attenuating noise on a second power-supply rail, wherein both means are integrated on a chip, and the second power-supply rail is coupled to a higher power-supply voltage than the first power-supply rail. The means for attenuating noise on the first power-supply rail and the means for attenuating noise on the second power-supply rail share a common electrode.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIGS. 8A-8K illustrate an exemplary process for fabricating the MIM capacitor structure in FIG. 2 according to an embodiment of the present disclosure.

FIGS. 9A-9K illustrate an exemplary process for fabricating the MIM capacitor structure in FIG. 4 according to an embodiment of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
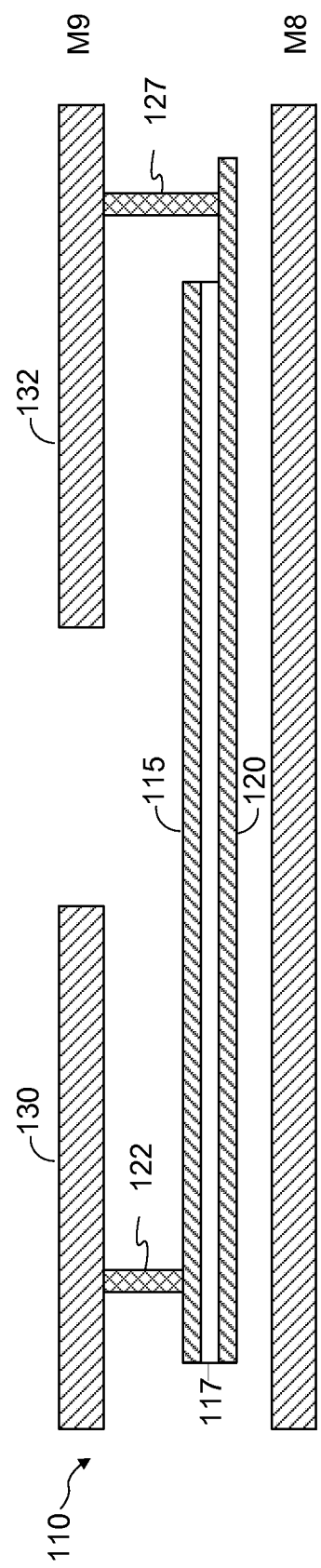
FIG. 1 shows an example of a MIM capacitor structure.

Decoupling capacitors are commonly used to filter out noise on a power supply, in which the decoupling capacitors are coupled between two power-supply rails (e.g., Vdd and Vss) of the power supply. FIG. 1 shows an example of a metal-insulator (MIM) capacitor structure 110 currently used to implement decoupling capacitors. The MIM capacitor structure 110 may be placed in the back end of line (BEOL) portion of a chip between interconnect metals M8 and M9, as shown in FIG. 1.

The MIM capacitor structure 110 comprises a top metal layer 115, a bottom metal layer 120, and a dielectric layer 117 disposed between the top and bottom metal layers 115 and 120. The top metal layer 115 is coupled to a first power-supply rail 130 by a first via 122 and the bottom metal layer 120 is coupled to a second power-supply rail 132 by a second via 127. The first power-supply rail 130 may be coupled to Vdd of a power supply and the second power-supply rail 127 may be coupled to Vss of the power supply.

The capacitor structure 110 shown in FIG. 1 only supports one of two different types of capacitors on a single chip: high-voltage capacitors with low capacitance density or low-voltage capacitors with high capacitance density. For example, high-voltage capacitors may be used in high-voltage applications (e.g., when the power supply is used to power I/O devices). To realize high-voltage capacitors, the thickness of the dielectric layer 117 may be increased. Making the dielectric layer 117 thicker allows the MIM capacitor structure 110 to withstand higher voltages without breaking down. However, this reduces the capacitance density of the MIM capacitor structure 110.

Low-voltage capacitors may be used in low-voltage applications (e.g., when the power supply is used to power core devices). To realize low-voltage capacitors with high capacitance density, the thickness of the dielectric layer 117 may be reduced. Making the dielectric layer 117 thinner increases the capacitance density of the MIM capacitor structure 110. However, this reduces the breakdown voltage of the dielectric layer 117, which may render the MIM capacitor structure 110 unsuitable for high-voltage applications.

When a chip designer uses the MIM capacitor structure 110 to implement decoupling capacitors on a chip, the chip designer can only select one of two options: implement high-voltage capacitors with low capacitance density (by increasing the thickness of the dielectric layer 117) or implement low-voltage capacitors with high capacitance density (by reducing the thickness of the dielectric layer 117). Once one of the options is selected, it must be implemented for the entire chip. A problem with this approach is that a chip may include both high-voltage devices (e.g., I/O devices) and low-voltage devices (e.g., core devices). Therefore, it is desirable for a MIM capacitor structure that is capable of providing both high-voltage capacitors with low capacitance density and low-voltage capacitors with high capacitance density on the same chip.

Embodiments of the present disclosure provide MIM capacitor structures capable of providing both low-voltage capacitors with high capacitance density and high-voltage capacitors on the same chip using one additional metal layer compared with the MIM capacitor structure 110 shown in FIG. 1.

Figure 2:
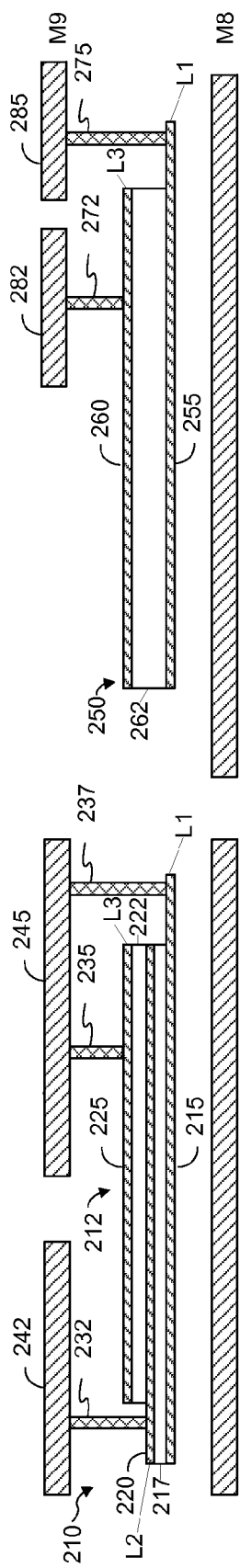
FIG. 2 shows a MIM capacitor structure providing both a high-voltage capacitor and a low-voltage capacitor according to an embodiment of the present disclosure.

FIG. 2 below shows a MIM capacitor structure 210 according to an embodiment of the present disclosure. The MIM capacitor structure 210 may be used to implement both a low-voltage capacitor 212 and a high-voltage capacitor 250 on the same chip using three metal layers L1, L2 and L3, as discussed further below. Each metal layer may comprise Titanium (Ti), Titanium Nitride (TiN), Tantalum (Ta), Tantalum Nitride (TaN), Copper (Cu), another type of metal, or any combination thereof.

In FIG. 2, the first and third metal layers L1 and L3 are the bottom-most and top-most metal layers, respectively, of the three metal layers L1, L2 and L3, and the second metal layer L2 is the middle metal layer. In this embodiment, the power supply for the chip has a low-supply voltage Vdd-Low (e.g., for powering core devices) and a high-supply voltage Vdd-High (e.g., for powering I/O devices), where Vdd-High is higher than Vdd-Low. For example, Vdd-High may be twice as high as Vdd-Low or higher.

The low-voltage capacitor 212 comprises a first electrode 215 formed from the first metal layer L1, a second electrode 220 formed form the second metal layer L2, and a third electrode 225 formed from the third metal layer L3. The first, second and third electrodes 215, 220 and 225 may be formed by patterning the first, second and third metal layers L1, L2 and L3 using masks (e.g., lithographic masks) that define the first, second and third electrodes 215, 220 and 225. Examples of processes for forming the electrodes from the metal layers are provided below. The low-voltage capacitor 212 also comprises a first dielectric layer 217 disposed between the first and second electrodes 215 and 220, and a second dielectric layer 222 disposed between the second and third electrodes 220 and 225. The first and second dielectric layers 217 and 222 may have approximately the same thickness or different thicknesses. Each dielectric layer may comprise a single layer of dielectric material or multiple layers of different dielectric materials.

The second electrode 220 is coupled to a first power-supply rail 242 by via 232, and the first and third electrodes 215 and 225 are coupled to a second power-supply rail 245 by vias 237 and 235, respectively. The first power-supply rail 242 may be coupled to Vdd-Low of the power supply and the second power-supply rail 245 may be coupled to Vss of the power supply, or vice versa. It is to be appreciated that each electrode 215, 220 and 225 may be coupled to the corresponding power-supply rail by more than one via.

Thus, the low-voltage capacitor 212 is implemented using all three metal layers L1, L2 and L3. The low-voltage capacitor 212 includes one additional metal layer compared with the MIM capacitor structure 110 in FIG. 1. However, the low-voltage capacitor 212 can provide approximately twice the capacitance density of the MIM capacitor structure 110 in FIG. 1. This is because the low-voltage capacitor 212 has approximately twice the surface area between electrodes (i.e., the surface area between the first and second electrodes 215 and 220 and the surface area between the second and third electrodes 220 and 225). Thus, the low-voltage capacitor 212 can achieve approximately twice the capacitance density at a cost of one additional metal layer compared with the MIM capacitor structure 110 in FIG. 1. Higher capacitance density is desirable for decoupling capacitors. This is because of higher current (due to more circuitry) and faster currents (due to higher frequencies) in integrated circuits, which require increased decoupling capacitance density to reduce noise on power supplies.

The high-voltage capacitor 250 is implemented using the first metal layer L1 (bottom-most metal layer) and the third metal layer L3 (top-most metal layer) without using the second metal layer L2 (middle metal layer). The high-voltage capacitor 250 comprises a fourth electrode 255 formed from the first metal layer L1 and a fifth electrode 260 formed from the third metal layer L3. The fourth and fifth electrodes 255 and 260 may be formed by patterning the first and third metal layers L1 and L3 using masks (e.g., lithographic masks) that define the fourth and fifth electrodes 255 and 260.

The high-voltage capacitor 250 also comprises a third dielectric layer 262 disposed between the fourth and fifth electrodes 255 and 260. The third dielectric layer 362 is thicker than either the first dielectric layer 217 or the second dielectric layer 222 of the low-voltage capacitor 210, and is therefore able to withstand higher voltages without breaking down. For instance, the third dielectric layer 262 may have a thickness approximately equal to the sum of the thicknesses of the first and second dielectric layers 217 and 222.

The fourth electrode 255 is coupled to a third power-supply rail 285 by via 275, and the fifth electrode 260 is coupled to a fourth power-supply rail 282 by via 272. The fourth power-supply rail 282 may be coupled to Vdd-High of the power supply and the third power-supply rail 285 may be coupled to Vss of the power supply, or vice versa.

Thus, the MIM capacitor structure 210 is able to provide both a low-voltage capacitor 212 with high capacitance density and a high-voltage capacitor 250 on the same chip by using all three metal layers L1, L2 and L3 to form the low-voltage capacitor 212 and using the first and third metal layers L1 and L3 (bottom-most and top-most metal layers) to form the high-voltage capacitor 250. The MIM capacitor structure 210 is able to achieve this at the cost of one additional metal layer compared with the MIM capacitor structure 110 in FIG. 1.

Although the low-voltage capacitor 210 and the high-voltage capacitor 250 are shown in close proximity to one another in FIG. 2 for ease of illustration, it is to be appreciated that these capacitors may be spaced farther apart on a chip. Further, although one low-voltage capacitor 212 and one high-voltage capacitor 250 are shown in FIG. 2, it is to be appreciated that any number of low-voltage capacitors and high-voltage capacitors may be fabricated on a chip based on the MIM capacitor structure 210 shown in FIG. 2.

The dielectric layers 217, 222 and 262 may comprise high-k dielectric materials such as, for example, hafnium-based high-k materials, tantalum-based high-k materials, or any combination thereof. The use of high-k materials for the dielectric layers increases capacitance density for a given dielectric thickness.

Figure 3:
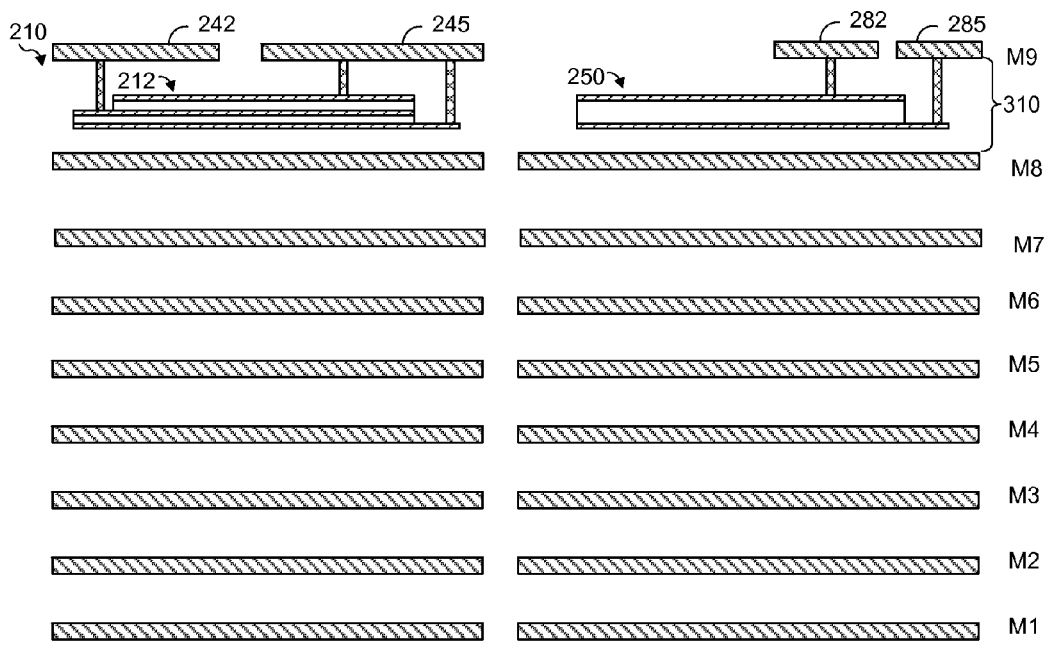
FIG. 3 shows a chip in which the MIM capacitor structure in FIG. 2 may be fabricated according to an embodiment of the present disclosure.

FIG. 3 shows an example of a chip 305 in which the MIM capacitor structure 210 may be fabricated. The chip 305 comprises at least nine interconnect metals M1 to M9 with insulators between the interconnect metals. M1 is the bottom-most interconnect metal and M9 is the upper-most interconnect metal shown in FIG. 3. The interconnect metals M1 to M9 may be used to interconnect various components of the chip 305. For ease of illustration, the structures (e.g., vias) interconnecting the interconnect metals M1 to M9 are not shown in FIG. 3.

In the example shown in FIG. 3, the MIM capacitor structure 210 is located between interconnect metals M8 and M9 of the chip 305, in which the power-supply rails 242, 245, 282 and 285 are formed out of interconnect metal M9. The capacitors 212 and 250 may be disposed within an insulator 310 (e.g., silicon oxide, silicon nitride, etc.) between interconnect metals M8 and M9. In one embodiment, the insulator 310 has a lower dielectric constant k than the dielectric layers 217, 222 and 262 of the MIM capacitor structure 210 to minimize parasitic capacitances. For example, the portion of the insulator 310 disposed between the third metal layer L3 and interconnect metal M9 may have a lower dielectric constant k to minimize parasitic capacitance between the upper electrodes 225 and 260 and interconnect metal M9. Similarly, the portion of the insulator 310 disposed between the first metal layer L1 and interconnect metal M8 may have a lower dielectric constant k to minimize parasitic capacitance between the lower electrodes 215 and 255 and interconnect metal M8.

It is to be appreciated that embodiments of the present disclosure are not limited to the example shown in FIG. 3. For example, it is to be appreciated that the MIM capacitor 210 is not limited to being located between interconnect metals M9 and M8, as shown in the example in FIG. 3, and that, in general, the MIM capacitor structure 210 may be located between any two adjacent interconnect metals. It is also to be appreciated that the spacing between adjacent interconnect metals and the thicknesses of the interconnect metals may vary within the chip 305.

Figure 4:
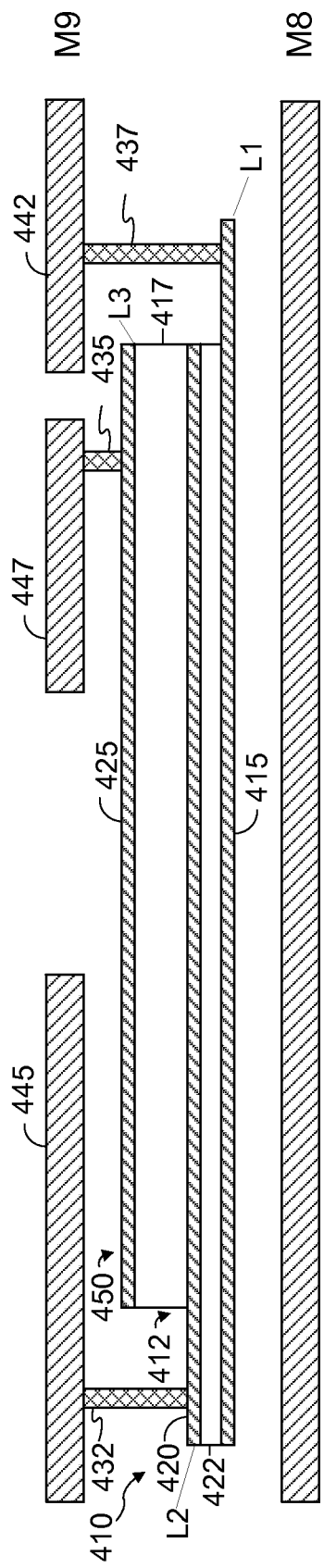
FIG. 4 shows a MIM capacitor structure providing both a high-voltage capacitor and a low-voltage capacitor according to another embodiment of the present disclosure.

FIG. 4 shows a MIM capacitor structure 410 according to another embodiment of the present disclosure. The MIM capacitor structure 410 may be used to implement both a low-voltage capacitor 412 and a high-voltage capacitor 450 on the same chip using three metal layers L1, L2 and L3. In FIG. 4, the spacing between the second and third metal layers L2 and L3 is greater than the spacing between the first and second metal layers L1 and L2.

The low-voltage capacitor 412 comprises a first electrode 415 formed from the first metal layer L1 and a second electrode 420 formed from the second metal layer L2. The first and second electrodes 415 and 420 may be formed by patterning the first and second metal layers L1 and L2 using masks (e.g., lithographic masks) that define the first and second electrodes 415 and 420. The low-voltage capacitor 412 also comprises a first dielectric layer 422 disposed between the first and second electrodes 415 and 420.

The first electrode 415 is coupled to a first power-supply rail 442 by via 437, and the second electrode is coupled to a second power-supply rail 445 by via 432. The first power-supply rail 442 may be coupled to Vdd-Low of the power supply and the second power-supply rail 445 may be coupled to Vss of the power supply. Thus, the low-voltage capacitor 412 may be couple between Vdd-Low and Vss of the power supply.

The high-voltage capacitor 450 comprises the second electrode 420 and a third electrode 425 formed from the third metal layer L3. Thus, the second electrode 420 is common to both the low-voltage capacitor 412 and the high-voltage capacitor 450, and may be coupled to Vss of the power supply. The high-voltage capacitor 450 also comprises a second dielectric layer 417 disposed between the second and third electrodes 420 and 425. Since the spacing between the second and third metal layers L2 and L3 is greater than the spacing between the first and second metal layers L1 and L2, the second dielectric layer 417 has a larger thickness than the first dielectric layer 422. The larger thickness of the second dielectric layer 417 allows the high-voltage capacitor 450 to sustain higher voltages without breaking down compared with the low-voltage capacitor 412.

The third electrode 415 is coupled to a third power-supply rail 447 by via 435. The third power-supply rail 447 may be coupled to Vdd-High of the power supply. As discussed above, the second electrode 420 may be coupled to Vss of the power supply. Thus, the high-voltage capacitor 450 may be coupled between Vdd-High and Vss of the power supply.

Thus, the MIM capacitor structure 410 is able to provide both a low-voltage capacitor 412 and a high-voltage capacitor 450 on the same chip by using different spacings between the first, second and third metal layers L1, L2 and L3. The MIM capacitor structure 410 is able to achieve this at the cost of one additional metal layer compared with the MIM capacitor structure 110 in FIG. 1.

Although the high-voltage capacitor 450 is shown above the low-voltage capacitor 412 in the example in FIG. 4, it is to be appreciated that the low-voltage capacitor 412 may be above the high-voltage capacitor 450. This may be done by making the dielectric layer between the first and second metal layers L1 and L2 thicker than the dielectric layer between the second and third metal layers L2 and L3 to form the high-voltage capacitor 450 on the bottom. In this case, the electrodes of the high-voltage capacitor 450 are formed from the first and second metal layers L2 and L3 and the electrodes of the low-voltage capacitor 412 are formed from the second and third metal layers L2 and L3. The electrode of the high-voltage capacitor 450 formed from the first metal layer L1 may be coupled to Vdd-High and the electrode of the low-voltage capacitor 412 formed from third metal layer L3 may be coupled to Vdd-Low. The electrode common to both capacitors and formed from metal layer L2 may be coupled to Vss, same as before.

Although one low-voltage capacitor 412 and one high-voltage capacitor 450 are shown in FIG. 4, it is to be appreciated that any number of low-voltage capacitors and high-voltage capacitors may be fabricated on a chip based on the MIM capacitor structure 410 shown in FIG. 4.

In an area of a chip that does not require operation at a high voltage, the high-voltage capacitor 450 may be used for low-voltage applications. In this case, the high-voltage capacitor 450 may be coupled in parallel with the low-voltage capacitor 412 to increase the decoupling capacitance density for low-voltage devices in that area. This may be done by coupling the third electrode 425 of the high-voltage capacitor 450 to Vdd-Low of the power supply instead of Vdd-High. Thus, the high-voltage capacitor 450 may be used for high-voltage applications in an area of a chip operating at a high voltage (e.g., an area of the chip with I/O devices), and may be used to increase the decoupling capacitance density for low-voltage applications in an area of the chip that does not require operation at a high voltage (e.g., an area of the chip with core devices).

The dielectric layers 417 and 422 may comprise high-k dielectric materials such as, for example, hafnium-based high-k materials, tantalum-based high-k materials, or any combination thereof. The use of high-k materials for the dielectric layers increases capacitance density for a given dielectric thickness.

Figure 5:
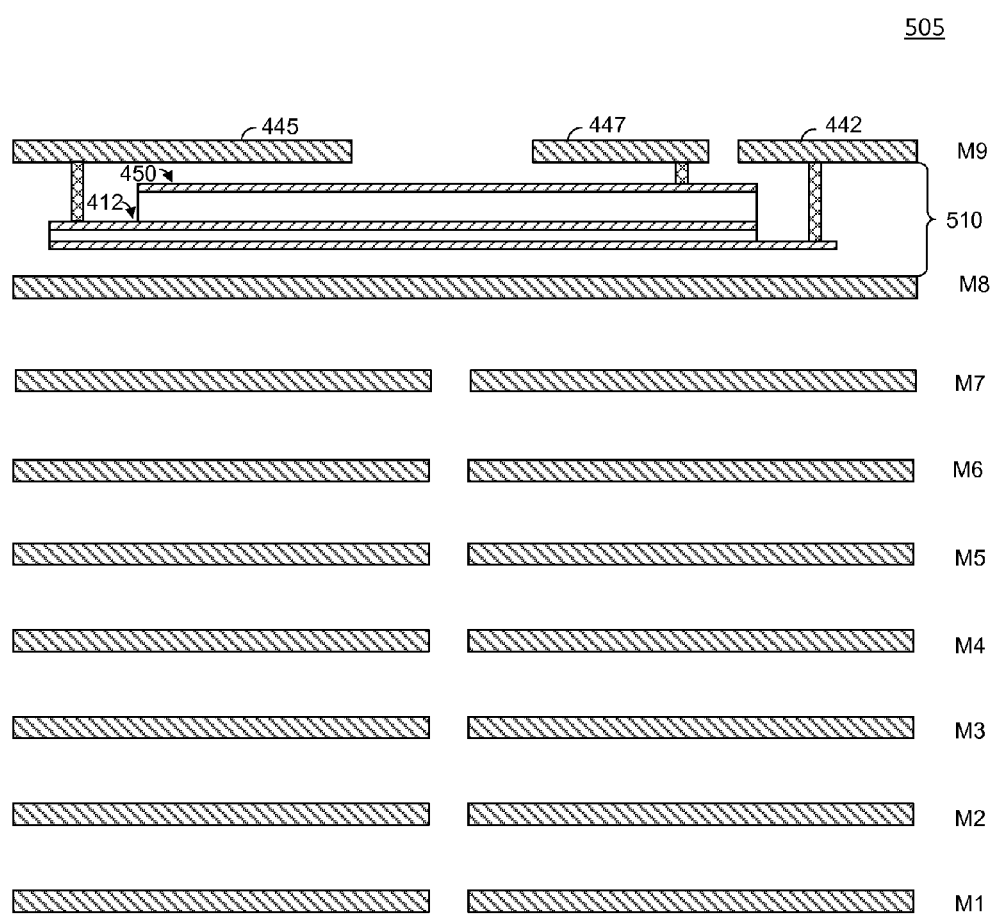
FIG. 5 shows a chip in which the MIM capacitor structure in FIG. 4 may be fabricated according to an embodiment of the present disclosure.

FIG. 5 shows an example of a chip 505 in which the MIM capacitor structure 410 may be fabricated. The chip 505 comprises at least nine interconnect metals M1 to M9 with insulators between the interconnect metals. In the example shown in FIG. 5, the MIM capacitor structure 410 is located between interconnect metals M8 and M9 of the chip 505, in which the power-supply rails 442, 445 and 447 are formed out of interconnect metal M9. The capacitors 412 and 450 may be disposed within an insulator 410 (e.g., silicon oxide, silicon nitride, etc.) between interconnect metals M8 and M9.

In one embodiment, the insulator 510 has a lower dielectric constant k than the dielectric layers 417 and 422 of the MIM capacitor structure 410 to minimize parasitic capacitances. For example, the portion of the insulator 510 disposed between the third metal layer L3 and interconnect metal M9 may have a lower dielectric constant k to minimize parasitic capacitance between the third electrode 425 and interconnect metal M9. Similarly, the portion of the insulator 510 disposed between the first metal layer L1 and interconnect metal M8 may have a lower dielectric constant k to minimize parasitic capacitance between the first electrode 415 and interconnect metal M8. It is to be appreciated that embodiments of the present disclosure are not limited to the example shown in FIG. 5. For example, it is to be appreciated that the MIM capacitor 410 is not limited to being located between interconnect metals M9 and M8, as shown in the example in FIG. 5, and that, in general, the MIM capacitor structure 410 may be located between any two adjacent interconnect metals.

Figure 6:
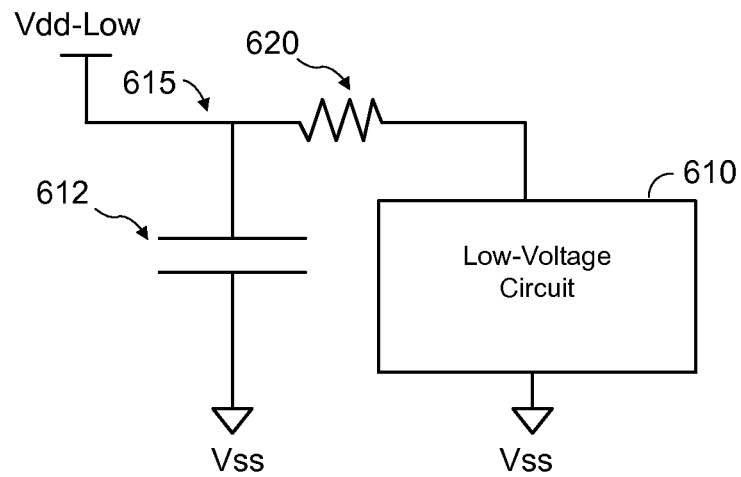
FIG. 6 is a circuit diagram of a low-voltage capacitor coupled to a low-voltage circuit according to an embodiment of the present disclosure.

FIG. 6 shows a circuit diagram of a low-voltage capacitor 612 used as a decoupling capacitor for a low-voltage circuit 610 in a chip according to an embodiment of the present disclosure. The low-voltage capacitor 612 may be implemented using the low-voltage capacitor 212 in FIG. 2 or the low-voltage capacitor 412 in FIG. 4. The low-voltage capacitor 612 may be coupled to the low-voltage circuit 610 via a power-supply rail 615 comprising one or more interconnect metals. The low-voltage capacitor 612 attenuates noise on the power-supply rail 615. The noise may be introduced into the power-supply rail 615 from other circuits (not shown) coupled to the power-supply rail 615.

The power-supply rail 615 may include resistance between the low-voltage capacitor 612 and the low-voltage circuit 610, which is represented by resistor 620 in FIG. 6. The resistance is undesirable because it introduces an RC time constant that slows the response time for supplying current to the low-voltage circuit 610. The resistance can be reduced by fabricating the low-voltage capacitor 612 as close as possible to the low-voltage circuit 610 to minimize the length of the power-supply rail 615 between the low-voltage capacitor 612 and the low-voltage circuit 610. In this regard, the metal layers L1, L2 and L3 may be available throughout the chip, allowing the low-voltage capacitor 612 to be fabricated in close proximity to the low-voltage circuit using two or more of the metal layers L1, L2 and L3.

The low-voltage capacitor 612 is also coupled to Vdd-Low (e.g., 0.9 V) of the power supply via the power-supply rail 615. The power-supply rail 615 may include additional resistance between the power supply and the low-voltage capacitor 612. Also, one or more decoupling capacitors (not shown) and/or one or more circuits (not shown) may be coupled to the power-supply rail 615 between the power supply and the low-voltage capacitor 612. The low-voltage circuit 610 may include one or more core devices (e.g., core transistors with relatively thin gate oxides) that can be damaged if exposed to voltages much higher than Vdd-Low.

Figure 7:
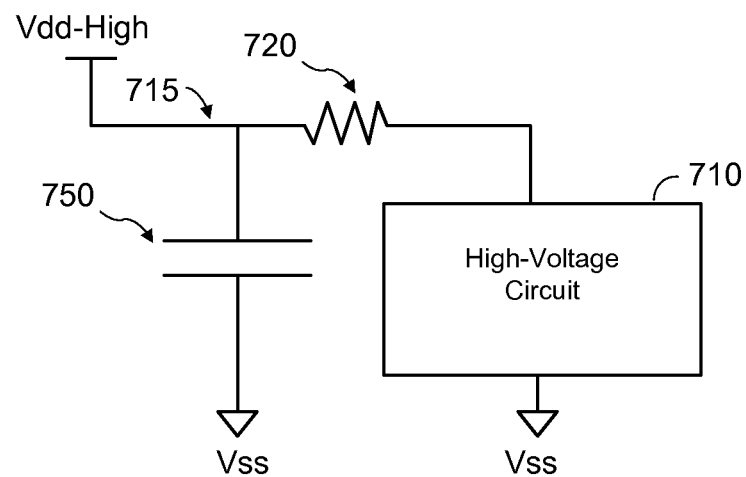
FIG. 7 is a circuit diagram of a high-voltage capacitor coupled to a high-voltage circuit according to an embodiment of the present disclosure.

FIG. 7 shows a circuit diagram of a high-voltage capacitor 750 used as a decoupling capacitor for a high-voltage circuit 710 in a chip according to an embodiment of the present disclosure. The high-voltage capacitor 750 may be implemented using the high-voltage capacitor 250 in FIG. 2 or the high-voltage capacitor 450 in FIG. 4. The high-voltage capacitor 750 may be coupled to the high-voltage circuit 710 via a power-supply rail 715 comprising one or more interconnect metals. The high-voltage capacitor 750 attenuates noise on the power-supply rail 715. The noise may be introduced into the power-supply rail 715 from other circuits (not shown) coupled to the power-supply rail 715.

The power-supply rail 715 may include resistance between the high-voltage capacitor 750 and the high-voltage circuit 710, which is represented by resistor 720 in FIG. 7. The resistance can be reduced by fabricating the high-voltage capacitor 750 as close as possible to the high-voltage circuit 710 to minimize the length of the power-supply rail 715 between the high-voltage capacitor 710 and the high-voltage circuit 710. In this regard, the metal layers L1, L2 and L3 may be available throughout the chip, allowing the high-voltage capacitor 750 to be fabricated in close proximity to the low-voltage circuit using two of the metal layers L1, L2 and L3 (e.g., metal layers L1 and L3 for the high-voltage capacitor 250 in FIG. 2 and metal layers L2 and L3 for the high-voltage capacitor 450 in FIG. 4).

The high-voltage capacitor 750 is also coupled to Vdd-High (e.g., 1.8V to 5.0 V) of the power supply via the power-supply rail 715. The power-supply rail 715 may include additional resistance between the power supply and the high-voltage capacitor 750. Also, one or more decoupling capacitors (not shown) and/or one or more circuits (not shown) may be coupled to the power-supply rail 715 between the power supply and the high-voltage capacitor 750.

The high-voltage circuit 710 may include one or more I/O devices for interfacing the chip to one or more external devices (off-chip devices). For example, the I/O devices may include I/O transistors having thicker gate oxides than core transistors in the chip, and therefore able to sustain higher voltages than the core transistors. The I/O devices may be located near the periphery of the chip, and may be used to drive high-voltage signals to and/or receive high-voltage signals from one or more external devices. The I/O devices may communicate with core devices in the chip though one or more voltage-level shifters (not shown) that convert high-voltage signals into low-voltage signals, and vice versa.

Figure 8A:
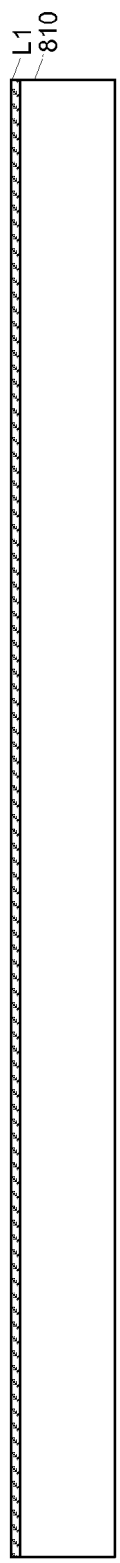

FIGS. 8A-8K illustrate an exemplary process for fabricating the MIM capacitor structure 210 in FIG. 2 according to an embodiment of the present disclosure. FIG. 8A shows a lower insulating layer 810 and the first metal layer L1 deposited over the insulating layer 810. The lower insulating layer 810 may have a lower dielectric constant k than the dielectric layers 217, 222 and 262 of the MIM capacitor structure 210, and may be formed over interconnect metal M8 (not shown) or another interconnect metal. The first metal layer L1 may be deposited over the lower insulating layer 810 using any deposition technique (e.g., sputtering, chemical vapor deposition (CVD), etc.).

Figure 8B:
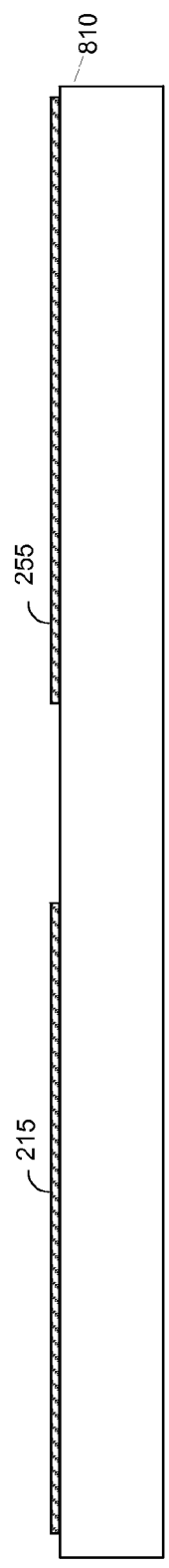

FIG. 8B shows the first metal layer L1 after it has been patterned and etched to form the first electrode 215 of the low-voltage capacitor 212 and the fourth electrode 255 of the high-voltage capacitor 250. The first metal layer L1 may be patterned and etched using conventional photolithography or another technique.

Figure 8C:
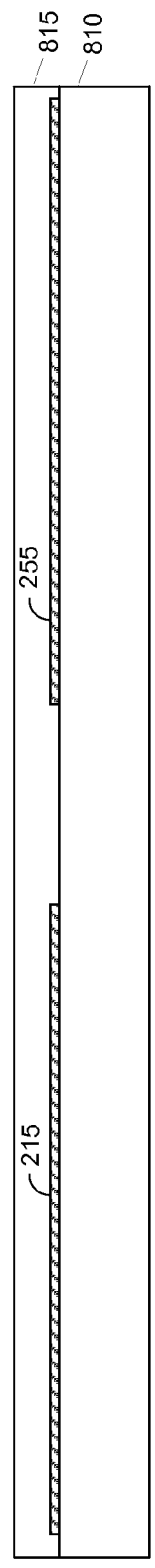

FIG. 8C shows a lower dielectric layer 815 deposited over the first and fourth electrodes 215 and 255. The lower dielectric layer 815 may be deposited using CVD or another technique, and may have a higher dielectric constant K than the lower insulating layer 810.

Figure 8D:
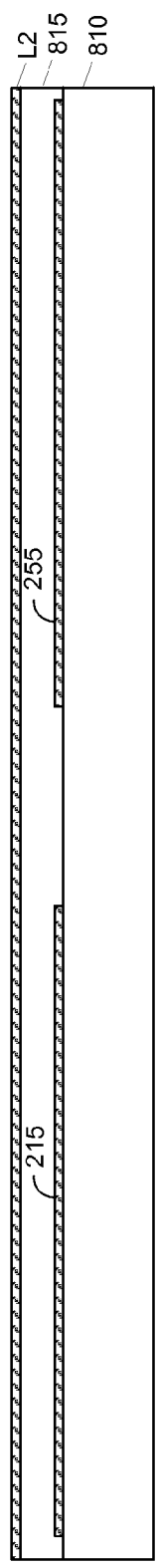

FIG. 8D shows the second metal layer L2 deposited over the lower dielectric layer 815. The second metal layer L2 may be deposited over the lower dielectric layer 815 using any deposition technique (e.g., sputtering, chemical vapor deposition (CVD), etc.).

FIG. 8E shows the second metal layer L2 after it has been patterned and etched to form the second electrode 220 of the low-voltage capacitor 212 (e.g., using photolithography or another technique). The portion of the second metal layer L2 overlapping the fourth electrode 255 of the high-voltage capacitor 250 is removed (etched away) since the second metal layer L2 is not used for the high-voltage capacitor 250. The portion of the dielectric layer 815 between the first and second electrodes 215 and 220 forms the first dielectric layer 217 of the low-voltage capacitor 212.

FIG. 8F shows an upper dielectric layer 820 deposited over the second electrode 220 and the lower dielectric layer 815 (e.g., using CVD or another technique). The upper dielectric layer 820 may have a higher dielectric constant K than the lower insulating layer 810.

FIG. 8G shows the third metal layer L3 deposited over the dielectric layer 820 (e.g., using sputtering, chemical vapor deposition (CVD), etc.). FIG. 8H shows the third metal layer L3 after it has been patterned and etched to form the third electrode 225 of the low-voltage capacitor 212 and the fifth electrode 260 of the high-voltage capacitor 250 (e.g., using photolithography or another technique). The portion of the upper dielectric layer 820 between the second and third electrodes 220 and 225 forms the second dielectric layer 222 of the low-voltage capacitor 212, and the portion of the lower and upper dielectric layers 815 and 820 between the fourth and fifth electrodes 255 and 260 form the third dielectric layer 262 of the high-voltage capacitor 250.

FIG. 8I shows an upper insulating layer 825 deposited over the third and fifth electrodes 225 and 260 (e.g., using CVD or another technique). The upper insulating layer 825 may have a lower dielectric constant K than the dielectric layers 217, 222 and 262 of the MIM capacitor structure 210.

FIG. 8J shows the vias 232, 235, 237, 272 and 275 formed through the dielectric layers 815 and 820 and the insulating layer 825 to provide electrical connections to the electrodes 220, 225, 215, 260 and 255, respectively. FIG. 8J also shows an interconnect metal 830 deposited over the insulating layer 825 (e.g., using sputtering, CVD, etc.). The interconnect metal 830 is deposited after formation of the vias and may correspond to interconnect metal M9 shown in the example in FIG. 2 or another interconnect metal.

The vias 232, 235, 237, 272 and 275 may be formed by etching holes in the dielectric layers 815 and 820 and the insulating layer 825, and depositing conductive material(s) in the holes. It is to be appreciated that the vias 232, 235, 237, 272 and 275 may be formed over multiple process steps. For example, the vias 232, 235, 237, 272 and 275 may be formed by etching holes into each one of the dielectric layers 815 and 820 and the insulating layer 825 in separate process steps, and depositing conductive material(s) in the holes of each one of the dielectric layers 815 and 820 and the insulating layers 825 in separate process steps. Although FIG. 8J shows the vias 232, 235, 237, 272 and 275 being formed after formation of the electrodes 215, 220, 225, 255 and 260, it is to be appreciated that these vias may be formed over multiple process steps that are interspersed with the process steps for forming the electrodes 215, 220, 225, 255 and 260.

FIG. 8K shows the interconnect metal 830 after it has been patterned and etched to form the power-supply rails 242, 245, 282 and 285 (e.g., using photolithography or another technique).

It is to be appreciated that the order of the steps shown in FIGS. 8A-8K is exemplary only, and that the steps may be performed in a different order. For example, the lower dielectric layer 815 may be deposited over the first metal layer L1 before formation of the first and fourth electrodes 215 and 255. In this example, portions of the lower dielectric layer 815 may be selectively etched away to expose portions of the first metal layer L1 that are to be removed to form the first and fourth electrodes 215 and 255. The exposed portions of the first metal layer L1 may then be etched away to form the first and fourth electrodes 215 and 255.

Further, it is to be appreciated that each of the electrodes 215, 220, 225, 255 and 260 may be formed from the respective metal layer using techniques other than the exemplary techniques discussed above. For example, the first electrode 215 may be formed by etching a trench into the insulating layer 810 corresponding to the first electrode. The trench may have the same dimensions of the first electrode 215 to be formed therein. The first metal layer L1 may then be deposited over the insulating layer 810, in which a portion of the first metal layer L1 fills the trench, forming the first electrode 215. The excess portions of the first metal layer L1 above the trench may then be removed using chemical-mechanical polishing (CMP) or another planarization technique.

Figure 9A:
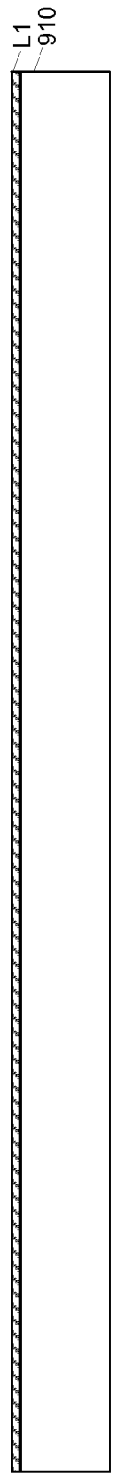

FIGS. 9A-9K illustrate an exemplary process for fabricating the MIM capacitor structure 410 in FIG. 4 according to an embodiment of the present disclosure. FIG. 9A shows a lower insulating layer 910 and the first metal layer L1 deposited over the lower insulating layer 910. The lower insulating layer 910 may have a lower dielectric constant k than the dielectric layers 417 and 422 of the MIM capacitor structure 410, and may be formed over interconnect metal M8 (not shown) or another interconnect metal. The first metal layer L1 may be deposited over the lower insulating layer 910 using any deposition technique (e.g., sputtering, chemical vapor deposition (CVD), etc.).

Figure 9B:
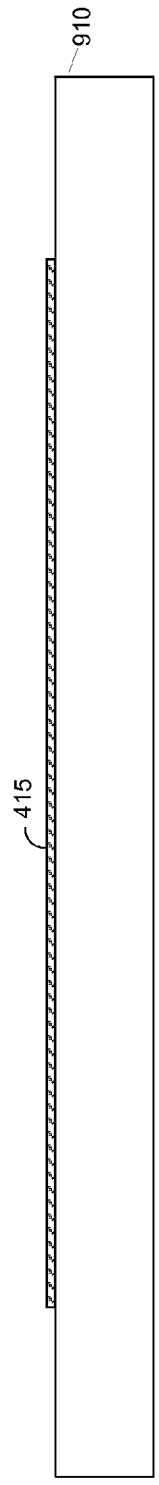

FIG. 9B shows the first metal layer L1 after it has been patterned and etched to form the first electrode 415. The first metal layer L1 may be patterned and etched using conventional photolithography or another technique.

Figure 9C:
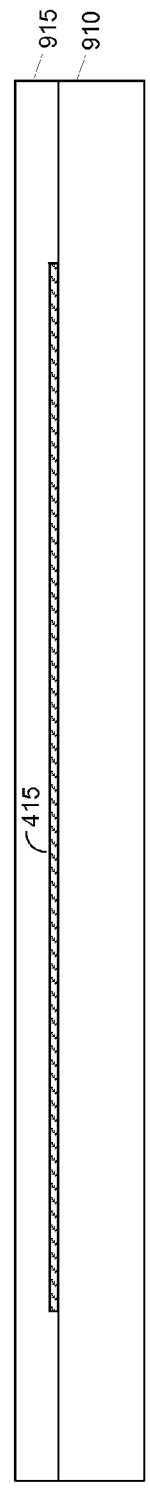

FIG. 9C shows a lower dielectric layer 915 deposited over the first electrode 415. The lower dielectric layer 915 may be deposited using CVD or another technique, and may have a higher dielectric constant K than the insulating layer 910.

Figure 9D:
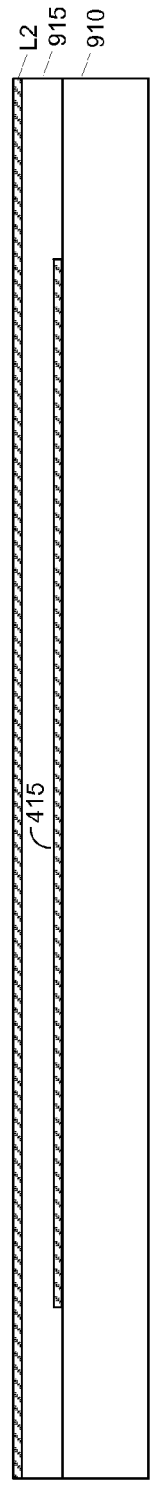

FIG. 9D shows the second metal layer L2 deposited over the lower dielectric layer 915. The second metal layer L2 may be deposited over the lower dielectric layer 915 using any deposition technique (e.g., sputtering, chemical vapor deposition (CVD), etc.).

FIG. 9E shows the second metal layer L2 after it has been patterned and etched to form the second electrode 420 (e.g., using photolithography or another technique). The portion of the lower dielectric layer 915 between the first and second electrodes 415 and 420 forms the first dielectric layer 422 shown in FIG. 4.

FIG. 9F shows an upper dielectric layer 920 deposited over the second electrode 420 (e.g., using CVD or another technique). The upper dielectric layer 920 may have a higher dielectric constant K than the lower insulating layer 910. The dielectric layer 920 may also have a thickness greater than the thickness of the dielectric layer 915.

FIG. 9G shows the third metal layer L3 deposited over the upper dielectric layer 920 (e.g., using sputtering, chemical vapor deposition (CVD), etc.). FIG. 9H shows the third metal layer L3 after it has been patterned and etched to form the third electrode 425 (e.g., using photolithography or another technique). The portion of the upper dielectric layer 920 between the second and third electrodes 920 and 925 forms the second dielectric layer 417.

FIG. 9I shows an upper insulating layer 925 deposited over the third electrode 925 (e.g., using CVD or another technique). The upper insulating layer 925 may have a lower dielectric constant K than the dielectric layers 417 and 422 of the MIM capacitor structure 410.

Figure 9J:
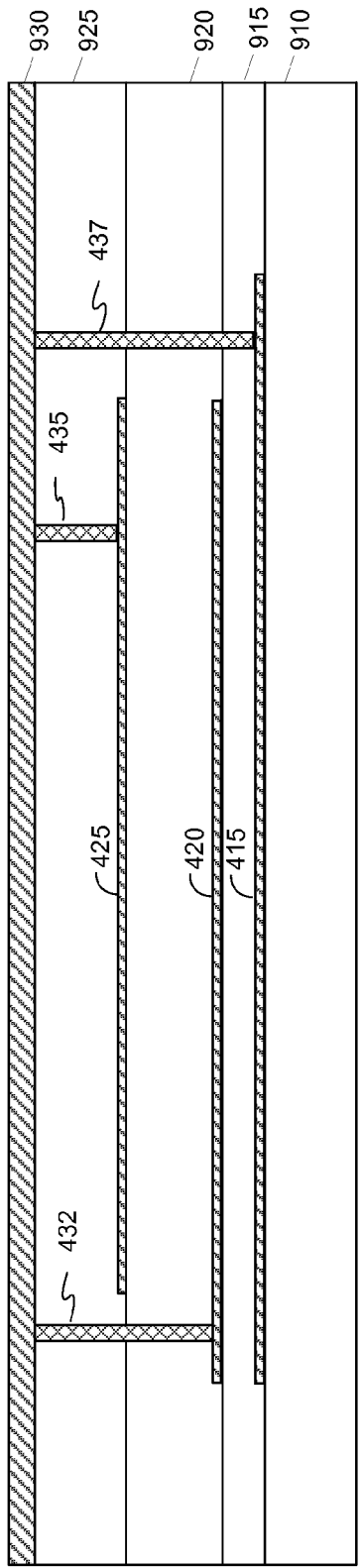

FIG. 9J shows the vias 432, 435 and 437 formed through the dielectric layers 915 and 920 and the insulating layer 925 to provide electrical connections to the electrodes 420, 425 and 415, respectively. FIG. 9J also shows an interconnect metal 930 deposited over the insulating layer 925 (e.g., using sputtering, CVD, etc.). The interconnect metal 930 is deposited after formation of the vias and may correspond to interconnect metal M9 shown in the example in FIG. 4 or another interconnect metal.

Figure 9K:
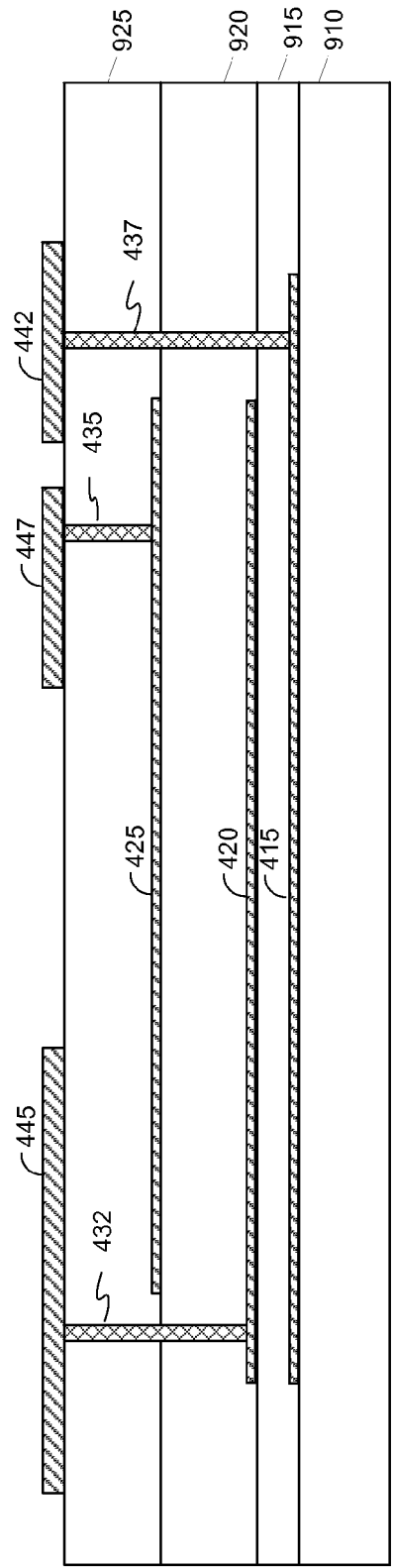

FIG. 9K shows the interconnect metal 930 after it has been patterned and etched to form the power-supply rails 445, 447 and 442 (e.g., using photolithography or another technique).

Figure 10:
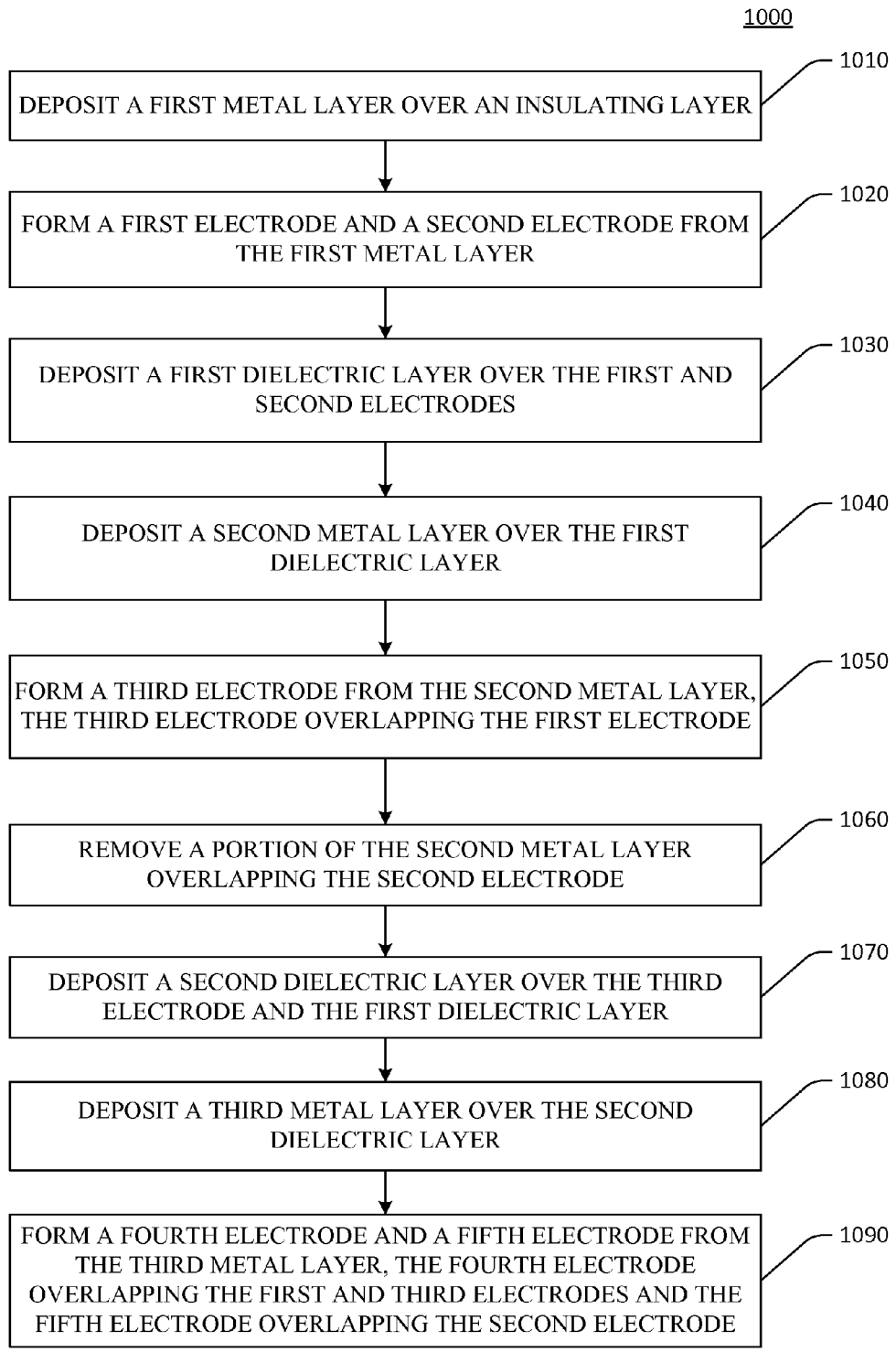
FIG. 10 is a flowchart of a method for fabricating a capacitor structure according to an embodiment of the present disclosure.

FIG. 10 shows a method 1000 for fabricating a capacitor structure (e.g., the MIM capacitor structure 210) according to an embodiment of the present disclosure.

In step 1010, a first metal layer is deposited over an insulating layer. For example, the first metal layer (e.g., first metal layer L1) may be deposited on the insulating layer (e.g., lower insulating layer 810) using sputtering, CVD or another deposition technique.

In step 1020, a first electrode and a second electrode are formed from the first metal layer. For example, the first electrode (e.g., first electrode 215) and the second electrode (e.g., fourth electrode 255) may be formed by patterning and etching the first metal later using conventional photolithography or another technique.

In step 1030, a first dielectric layer is deposited over the first and second electrodes. For example, the first dielectric layer (e.g., lower dielectric layer 815) may be deposited using CVD or another technique, and may have a higher dielectric constant K than the insulating layer.

In step 1040, a second metal layer is deposited over the first dielectric layer. For example, the second metal layer (e.g., second metal layer L2) may be deposited on the first dielectric layer using sputtering, CVD or another deposition technique.

In step 1050, a third electrode is formed from the second metal layer, in which the third electrode overlaps the first electrode. For example, the third electrode (e.g., second electrode 220) may be formed by patterning an etching the second metal layer.

In step 1060, a portion of the second metal layer overlapping the second electrode is removed. For example, this portion of the second metal layer may be removed in a same etching process used to form the third electrode from the second metal layer.

In step 1070, a second dielectric layer is deposited over the third electrode and the first dielectric layer. For example, the second dielectric layer (e.g., upper dielectric layer 820) may be deposited using CVD or another technique, and may have a higher dielectric constant K than the insulating layer.

In step 1080, a third metal layer is deposited over the second dielectric layer. For example, the third metal layer (e.g., third metal layer L3) may be deposited on the first dielectric layer using sputtering, CVD or another deposition technique.

In step 1090, a fourth electrode and a fifth electrode are formed from the third metal layer, in which the fourth electrode overlaps the first and third electrodes and the fifth electrode overlaps the second electrode. For example, the fourth and fifth electrodes (e.g, third electrode 225 and fifth electrode 260) may be formed by patterning or etching the third metal layer.

Figure 11:
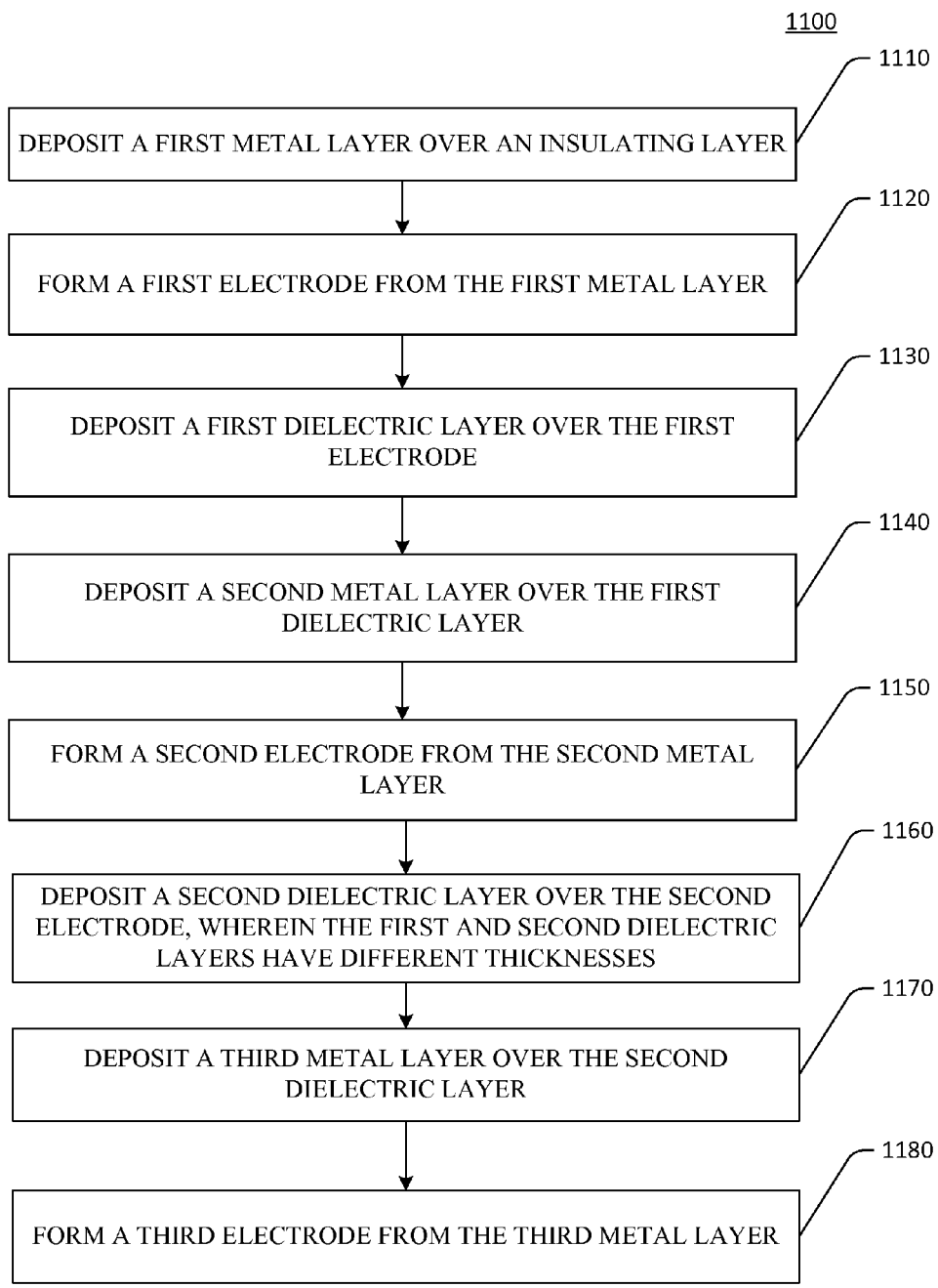
FIG. 11 is a flowchart of a method for fabricating a capacitor structure according to another embodiment of the present disclosure.

FIG. 11 shows method 1100 for fabricating a capacitor structure (e.g., the MIM capacitor structure 410) according to another embodiment of the present disclosure.

In step 1110, a first metal layer is deposited over an insulating layer. For example, the first metal layer (e.g., first metal layer L1) may be deposited on the insulating layer (e.g., lower insulating layer 910) using sputtering, CVD or another deposition technique.

In step 1120, a first electrode is formed from the first metal layer. For example, the first electrode (e.g., first electrode 415) may be formed by patterning and etching the first metal later using conventional photolithography or another technique.

In step 1130, a first dielectric layer is deposited over the first electrode. For example, the first dielectric layer (e.g., lower dielectric layer 915) may be deposited using CVD or another technique, and may have a higher dielectric constant K than the insulating layer.

In step 1140, a second metal layer is deposited over the first dielectric layer. For example, the second metal layer (e.g., second metal layer L2) may be deposited on the first dielectric layer using sputtering, CVD or another deposition technique.

In step 1150, a second electrode is formed from the second metal layer. For example, the second electrode (e.g., second electrode 420) may be formed by patterning and etching the second metal later using conventional photolithography or another technique.

In step 1160, a second dielectric layer is deposited over the second electrode, wherein the first and second dielectric layers have different thicknesses. For example, the second dielectric layer (e.g., upper dielectric layer 920) may be thicker (e.g., 50 percent or more) than the first dielectric layer (e.g., lower dielectric layer 915).

In step 1170, a third metal layer is deposited over the second dielectric layer. For example, the third metal layer (e.g., third metal layer L3) may be deposited on the second dielectric layer using sputtering, CVD or another deposition technique.

In step 1180, a third electrode is formed from the third metal layer. For example, the third electrode (e.g., third electrode 425) may be formed by patterning and etching the second metal later using conventional photolithography or another technique.

It is to be appreciated that the methods 1000 and 1100 discussed above are not limited to the order of steps shown in FIGS. 10 and 11, and that some of the steps may occur in a different order. Further, it is to be appreciated that one of the steps may be performed at substantially the same time as another one of the steps.

Figure 12:
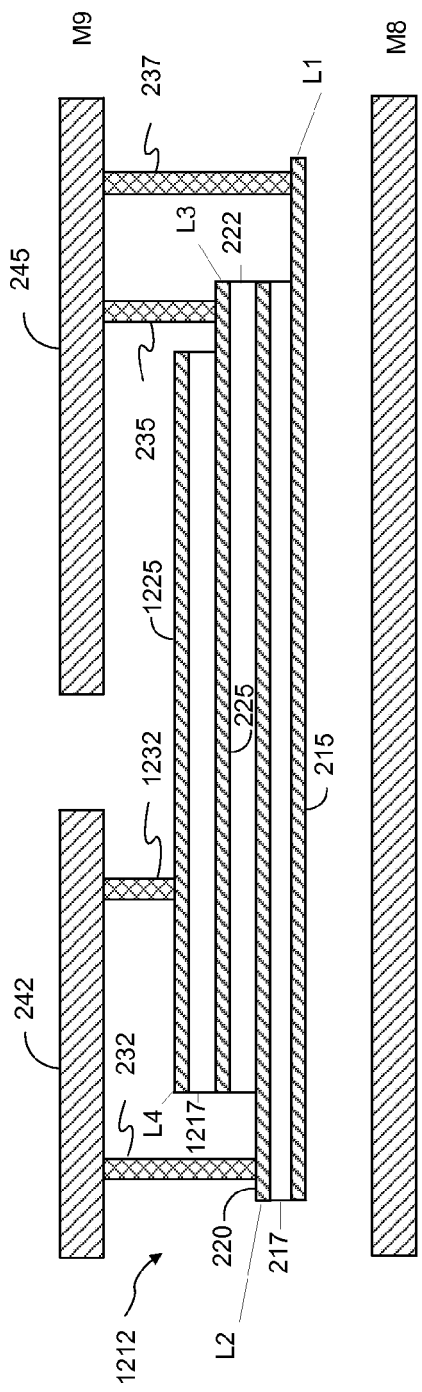
FIG. 12 shows a low-voltage capacitor formed from four metal layers according to an embodiment of the present disclosure.

Although embodiments of the present disclosure are discussed above using the example of three metal layers L1, L2 and L3, it is to be appreciated that the present disclosure is not limited to this example. For example, in one embodiment, a fourth metal layer L4 may be added above the third metal layer L3. In this embodiment, a low-voltage capacitor 1212 may include four electrodes formed from all four metal layers L1, L2, L3 and L4, an example of which is shown in FIG. 12. Compared with the low-voltage capacitor 212 shown in FIG. 2, the low-voltage capacitor 1212 in this example comprises an additional electrode 1225 formed from the fourth metal layer L4, and an additional dielectric layer 1217 between the electrodes 225 and 1225 formed from the third and fourth metal layers L3 and L4. The additional electrode 1225 may be coupled to the first power-supply 242 by via 1232. The low-voltage capacitor 1212 in this example provides a threefold increase in capacitance density compared with the MIM capacitor 110 in FIG. 1 at the cost of two additional metal layers.

Figure 13:
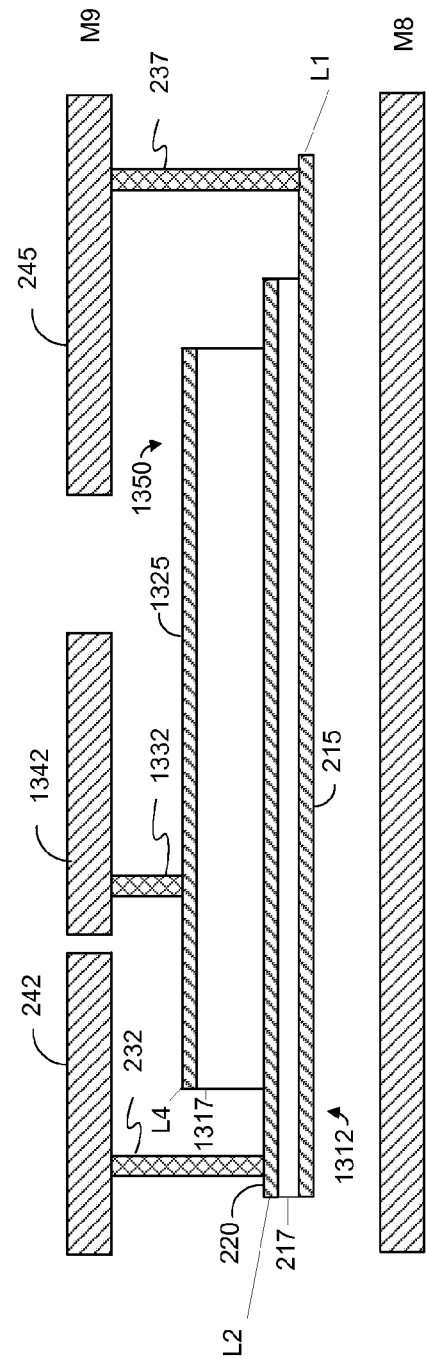
FIG. 13 shows a capacitor structure comprising both a high-voltage capacitor and a low-voltage capacitor according to an embodiment of the present disclosure.

Also, in this embodiment, both a high-voltage capacitor 1350 and a low-voltage capacitor 1312 may be formed by removing (not using) the third metal layer L3, an example of which is shown in FIG. 13. In this example, the high-voltage capacitor 1350 may include electrodes 220 and 1325 formed from the second and fourth metal layers L2 and L4, and the low-voltage capacitor 1312 includes electrodes 215 and 220 formed from the first and second metal layers L1 and L2. The high-voltage capacitor 1350 has a thicker dielectric layer 1317 than the low-voltage capacitor 1312 due to the removal of the third metal layer L3 between the second and fourth metal layers L2 and L4. The top electrode of the high-voltage capacitor 1350 may be coupled to an addition power-supply rail 1342 by via 1332. In this example, the electrode 220 common to both capacitors 1312 and 1350 may be coupled to Vss of the power supply, the top electrode 1325 of the high-voltage capacitor 1350 may be coupled to Vdd-High of the power supply and the bottom electrode 215 of the low-voltage capacitor 1312 may be coupled to Vdd-Low of the power supply. The capacitors shown in FIGS. 12 and 13 may be fabricated on the same chip.

In the example shown in FIG. 13, the high-capacitor 1350 is shown above the low-voltage capacitor 1312. It is to be appreciated that the high-voltage capacitor 1350 may be placed on the bottom by removing the second metal layer L2 instead of the third metal layer L3. In this case, the high-voltage capacitor may include electrodes formed from the first and third metal layers L1 and L3 and the low-voltage capacitor may include electrodes formed from the third and fourth metal layers L3 and L4.

As discussed above, aspects of the present disclosure may be extended to four metal layers L1, L2, L3 and L4. In general, aspects of the present disclosure may be extended to any number of metal layers. For example, in general, a low-voltage capacitor may be formed using any number of metal layers, in which electrodes formed from odd numbered metal layers may be coupled to Vss and electrodes formed from even numbered metal layers may be coupled Vdd-Low, or vice versa. In general, a high-voltage capacitor may be formed by removing (not using) one or more of the metal layers used for the low-voltage capacitor.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A capacitor structure, comprising:
a first electrode formed from a first metal layer;
a second electrode formed from a second metal layer;
a third electrode formed from a third metal layer, wherein the second and third electrodes are spaced farther apart than the first and second electrodes;
a first dielectric layer between the first and second electrodes to form a first decoupling capacitor therebetween, wherein the first decoupling capacitor comprises a first capacitance and a first break down voltage;
a second dielectric layer between the second and third metal layers to form a second decoupling capacitor therebetween, wherein the second decoupling capacitor comprises a second capacitance and a second break down voltage, wherein the second dielectric layer has a larger thickness than the first dielectric layer such that the first capacitance is greater than the second capacitance, and the first break down voltage is less than the second break down voltage;
a fourth electrode formed from the first metal layer;
a fifth electrode formed from the second metal layer;
a sixth electrode formed from the third metal layer;
a third dielectric layer between the fourth and fifth electrodes to form a third decoupling capacitor therebetween, wherein the third decoupling capacitor comprises a third capacitance and a third break down voltage;
a fourth dielectric layer between the fifth and sixth metal lavers to form a fourth decoupling capacitor therebetween, wherein the fourth decoupling capacitor comprises a fourth capacitance and a fourth break down voltage, wherein the fourth dielectric layer has a larger thickness than the third dielectric layer such that the third capacitance is greater than the fourth capacitance, and the third break down voltage is less than the fourth break down voltage;
wherein the first, fourth, and sixth electrodes are coupled to a first power-supply rail, the third electrode is coupled to a second power-supply rail, the second and fifth electrodes are coupled to a third power-supply rail, the second power-supply rail has a higher power-supply voltage than that of the first power-supply rail, and the third power-supply rail is coupled to ground.

2. The capacitor structure of claim 1, wherein the capacitor structure is disposed within an insulator between a first interconnect metal and a second interconnect metal, and the insulator has a lower dielectric constant k than each of the first and second dielectric layers.

3. The capacitor structure of claim 1, wherein the first electrode is coupled to a first transistor, and the third electrode is coupled to a second transistor, the second transistor having a thicker gate oxide than the first transistor.

4. The capacitor structure of claim 1, wherein the first and second decoupling capacitors are disposed within an insulator between a first interconnect metal and a second interconnect metal, and the insulator has a lower dielectric constant k than each of the first and second dielectric layers.

5. The capacitor structure of claim 4, wherein the first electrode is electrically coupled to a first patterned portion of the first interconnect metal, wherein the second electrode is electrically coupled to a second patterned portion of the first interconnect metal, and wherein the third electrode is electrically coupled to a third patterned portion of the first interconnect metal.

6. The capacitor structure of claim 5, further comprising:
a first metallized via electrically coupling the first electrode to the first patterned portion of the first interconnect metal;
a second metallized via electrically coupling the second electrode to the second patterned portion of the first interconnect metal; and
a third metallized via electrically coupling the third electrode to the third patterned portion of the first interconnect metal.

7. The capacitor structure of claim 4, wherein the first interconnect metal is positioned above all other interconnect metals of an integrated circuit.

8. An apparatus, comprising:
means for attenuating noise on a first power-supply rail, wherein the means for attenuating noise on the first power-supply rail comprises a first decoupling capacitor including a first dielectric layer disposed between first and second patterned metal layers, and wherein the first decoupling capacitor includes a first capacitance and a first break down voltage; and
means for attenuating noise on a second power-supply rail, wherein both means are integrated on a chip, and the second power-supply rail is coupled to a higher power-supply voltage than the first power-supply rail, wherein the means for attenuating noise on the second power-supply rail comprises a second decoupling capacitor including a second dielectric layer disposed between second and third patterned metal layers, wherein the second decoupling capacitor includes a second capacitance and a second break down voltage, and wherein the first capacitance is greater than the second capacitance, and the first break down voltage is less than the second break down voltage;
wherein the means for attenuating noise on the first power-supply rail further comprises:
a third decoupling capacitor including a third dielectric layer disposed between fourth and fifth patterned metal layers, and wherein the third decoupling capacitor includes a third capacitance and a third break down voltage; and
a fourth decoupling capacitor including a fourth dielectric layer disposed between fifth and sixth patterned metal layers, wherein the fourth decoupling capacitor includes a fourth capacitance and a fourth break down voltage, and wherein the third capacitance is greater than the fourth capacitance, and the third break down voltage is less than the fourth break down voltage.

9. The apparatus of claim 8, wherein the second dielectric layer is thicker than the first dielectric layer.

* * * * *